United States Patent [19]
Pramanik et al.

[11] Patent Number: 5,573,970
[45] Date of Patent: Nov. 12, 1996

[54] METHOD FOR REDUCING CONTAMINATION OF ANTI-FUSE MATERIAL IN AN ANTI-FUSE STRUCTURE

[75] Inventors: Dipankar Pramanik, Saratoga; Subhash R. Nariani, San Jose, both of Calif.

[73] Assignee: VLSI Technology, Inc., San Jose, Calif.

[21] Appl. No.: 477,311

[22] Filed: Jun. 6, 1995

Related U.S. Application Data

[62] Division of Ser. No. 275,187, Jul. 14, 1994, Pat. No. 5,493,146.
[51] Int. Cl.⁶ .......................... H01L 21/70; H01L 27/00
[52] U.S. Cl. ...................... 437/60; 437/922; 148/DIG. 55
[58] Field of Search ............. 437/922, 60; 148/DIG. 55

[56] References Cited

U.S. PATENT DOCUMENTS

| | | | |
|---|---|---|---|
| 5,120,679 | 6/1992 | Boardman | 437/195 |
| 5,233,217 | 8/1993 | Dixit et al. | 257/530 |
| 5,272,101 | 12/1993 | Forouhi et al. | 437/50 |
| 5,374,832 | 12/1994 | Tung et al. | 257/50 |
| 5,427,979 | 6/1995 | Chang | 437/922 |

FOREIGN PATENT DOCUMENTS

| | | |
|---|---|---|
| 910236385 | 3/1993 | Japan . |
| 92/20109 | 11/1992 | WIPO . |
| 9305514 | 3/1993 | WIPO . |
| 94/05041 | 3/1994 | WIPO . |
| 9511524 | 4/1995 | WIPO . |

*Primary Examiner*—H. Jey Tsai
*Attorney, Agent, or Firm*—Hickman, Beyer & Weaver, LLP

[57] ABSTRACT

An anti-fuse structure formed in accordance with the present invention includes a conductive layer base. A layer of anti-fuse material overlies the conductive base layer. On top of the anti-fuse layer is an insulating layer, in which a via hole is formed to the anti-fuse layer. The lateral dimension of the via hole is less than about 0.8 microns. Provided in the via hole is a conductive non-Al plug which overlies a layer of a a conductive barrier material such as TiN or TiW that contacts the anti-fuse material and overlies the insulating layer. Tungsten is effectively used as the non-Al plug. An electrically conductive layer is formed over the plug and is separated from the conductive barrier material overlying the anti-fuse layer by the plug. The structure is then programmable by application of a programming voltage and readable by application of a sensing voltage, which is lower than the programming voltage.

19 Claims, 4 Drawing Sheets

METHOD FOR REDUCING CONTAMINATION OF ANTI-FUSE MATERIAL IN AN ANTI-FUSE STRUCTURE

This is a divisional of application Ser. No. 08/275,187 filed on Jul. 14, 1994 now U.S. Pat. 5,493,146.

BACKGROUND OF THE INVENTION

This invention relates generally to integrated circuits and, more specifically, to anti-fuse structures in integrated circuits.

Programmable integrated circuits include such devices as field-programmable gate arrays and programmable read-only memories (PROMS). Such devices may include elements such as fuses or anti-fuses to enable them to be programmed.

Field programmable gate arrays include a large number of logic elements, such as AND gates and OR gates, which can be selectively coupled together by devices like fuses or anti-fuses to perform user-designed functions. The several types of PROMS, including standard, write-once PROMS, erasable programmable read-only memories (EPROMS), electrically erasable programmable read-only memories (EEPROMS), etc., usually comprise an array of memory cells arranged in rows and columns which can be programmed to store user data. An unprogrammed anti-fuse gate array or PROM is programmed by causing selected anti-fuses to become conductive.

Anti-fuses include a material which initially has a high resistance but which can be converted into a low resistance material by the application of a programming voltage. For example, amorphous silicon (A-Si), which has an intrinsic resistivity of approximately 1 megohm-cm, can be fashioned into 1 micron wide vias having a resistance of approximately 1–2 gigohms. These vias can then be transformed into a low resistance state by the application of a voltage in the range of 10–12 volts d.c. to form vias having a resistance less than 200 ohms. These low resistance vias can couple together logic elements of a field programmable gate array so that the gate array will perform user-defined functions or connect large functional blocks, or can serve as memory cells of a PROM.

An anti-fuse device is typically formed on a semiconductor wafer by depositing a bottom electrode layer, such as titanium-tungsten (TiW), depositing an oxide layer over the electrode layer, forming a via through the oxide layer to the electrode layer, and depositing A-Si into the via. A second layer of TiW can be deposited over the A-Si with an aluminum (Al) layer deposited over the TiW layer.

Problems arise in the above-described structure by "cusping" or thinning of the A-Si at the corners of the via that can lead to leakage and programming problems. Further, cusps formed in the A-Si layer can lead to poor step coverage of the TiW layer over the A-Si. This can cause an inadequate TiW barrier to be formed separating the top Al layer from the A-Si, which can compromise the reliability of the anti-fuse, because A to degrade or "poison" an anti-fuse structure by diffusing into the A-Si layer.

A prior art solution to this problem provides oxide spacers over the cusps of the A-Si. Such a structure is described in U.S. Pat. No. 5,120,679 issued to Boardman et al., the disclosure of which is incorporated herein by reference. This spacer better protects the corners of the via where the cusping or thinning of the A-Si is problematic. The spacer also improves the topography for the subsequent TiW barrier layer deposition. The use of dielectric spacers reduces leakage current and enhances reliability. However, the use of spacers may increase production time and cost. Further, the use of spacers results in reduced scalability of the structure below 1.0 micron (μm).

Alternatively, another anti-fuse structure is used for technology scaled to 0.8 μm, as the cross-sectional view of the anti-fuse structure in FIG. 1 illustrates. Overlying a silicon wafer substrate 8 on which a base oxide layer 9 has been formed are a first metal layer 10 (typically Al) and an inter-metal oxide (IMO) layer 12. A layer 14 of TiW is deposited and patterned to form a conductive "strap". Following formation of layer 14, a layer of A-Si 16 is deposited and then patterned to remain only in the desired locations overlying the TiW patterned layer 14. Thus, the A-Si is not deposited in the via as in the prior anti-fuse structures, but rather, forms a separate, planar layer. An oxide layer 18 is then deposited, followed by the etching of a via 20 through the oxide layer 18 to the A-Si layer 16. A barrier layer 22 of TiW is then preferably deposited over the oxide and into the via 20 to contact the A-Si layer 16. Subsequently, metal layer 24, preferably Al, is then deposited over the TiW layer, which prevents the Al layer 24 from poisoning the A-Si layer 16.

While the above-described structure is usable with 0.8 μm anti-fuse technology, the integrity of the anti-fuse is dependent on the integrity of the TiW barrier layer 22. This barrier layer has a problem of cusping or thinning at the corners 21 of the via 20. This cusping makes the corners more permeable to the migration of Al atoms from layer 24, which can lead to Al layer 24 diffusing into the A-Si layer 16, thereby "poisoning" the A-Si layer 16 at that point. By "poisoning" it is meant that the conductive aluminum atoms in the A-Si layer change the conductivity of the layer such that it cannot be properly programmed or read. The problem increases as the via is scaled to widths below 0.8 μm.

What is needed is an anti-fuse structure that retains the simplicity of the planar A-Si approach as illustrated in FIG. 1, but which does not have the problems associated with this approach, especially as the via width is scaled below 0.8 m.

SUMMARY OF THE INVENTION

In accordance with the present invention, an anti-fuse structure and method for forming an anti-fuse structure are described. In general, the anti-fuse structure uses a planar anti-fuse layer and is scalable to sub-micron size. Further, the problem of Al migration into the anti-fuse layer is overcome by the use of a non-Al conductor as a plug within the via hole.

A method for making an anti-fuse structure begins with the formation of a conductive base layer. An anti-fuse layer is then formed over the conductive base layer. Following this, an insulating layer is formed over the anti-fuse layer. A via hole is then etched through the insulating layer to the anti-fuse layer with the lateral dimension of the via being no more than approximately 0.8 microns. A conductive barrier material is then used to form a layer over the insulating layer and in the via hole to contact the anti-fuse layer. The conductive barrier material preferably consists essentially of TiW or TiN. A W layer is deposited after the conductive barrier material layer is formed. This W layer is preferably formed as a blanket layer, which is then etched-back to form a W plug in the via hole. An Al layer is preferably formed over the conductive barrier material and the W plug to act as the top conductive layer. The completed anti-fuse structure is then programmable by applying a programming voltage between the conductive base layer and the conductive barrier material, and is readable by application of a lower, sensing voltage between the layers, as is conventional in the art.

An anti-fuse structure in accordance with the present invention includes a conductive layer base. A layer of anti-fuse material overlies the conductive base layer. On top of the anti-fuse layer is an insulating layer, in which a via hole is formed to the anti-fuse layer. The lateral dimension of the via hole is preferably less than about 0.8 microns. Provided in the via hole to contact the anti-fuse material and over the insulating layer is a conductive barrier material preferably including either TiN or TiW. The structure also includes a W plug. This plug is formed by blanket deposition over the conductive barrier material, which is subsequently etched-back by well known processes. A top layer of Al is further included in the structure over the conductive barrier material. The structure is then programmable by application of a programming voltage and readable by application of a sensing voltage, which is lower than the programming voltage.

An advantage of the anti-fuse formed by the present invention is that there is no aluminum in the via hole to potentially poison the amorphous silicon. Further, the material and process used to form the non-aluminum vias are standard, so that the process and structure of the present invention are quite compatible with and easily incorporated into conventional semiconductor manufacturing processes.

These and other advantages of the present invention will become apparent upon reading the following detailed descriptions and studying the various figures of the drawings.

DETAILED DESCRIPTION OF THE PREFERRED EMBODIMENTS

Figure 1:
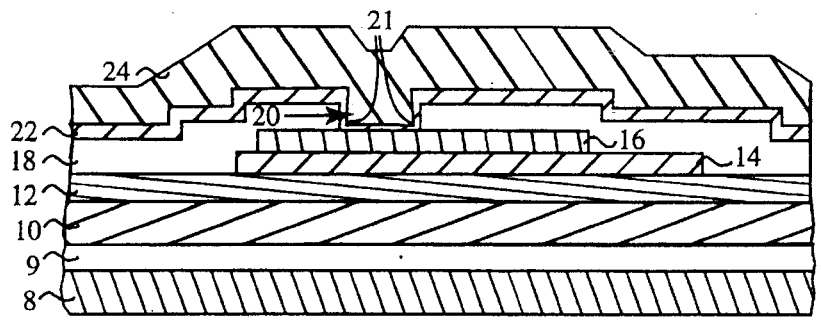
FIG. 1 is a cross-sectional view of an anti-fuse structure of the prior art.
Figure 2:
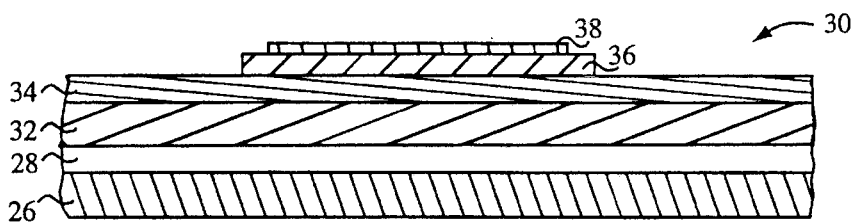
FIGS. 2–5 illustrate a step-by-step cross-sectional views of an anti-fuse structure formed in accordance with the present invention.

FIG. 1 was discussed in terms of the prior art. FIGS. 2–7 present step-by-step cross-sectional views of the formation of an anti-fuse structure by the methods of the present invention. In FIG. 2, processed substrate 30 includes a semiconductor wafer 26 (such as a silicon wafer), a base oxide layer 28 formed over the semiconductor wafer 26, a first metal layer 32 formed over the oxide layer 28, and an inter-metal oxide (IMO) layer 34 formed over the first metal layer 32. As described to this point, the structure is substantially standard to the industry.

A strap layer 36 of TiW is formed over these layers. The TiW of strap 36 is preferably sputter deposited to a thickness between about 1000 and 10,000 angstroms (Å), with 2200 Å being a preferable thickness. The TiW layer 36 is then patterned by standard photolithographic and etch techniques to form the strap 36.

As used herein, the term "patterned" refers to photolithographic etch techniques, whereby a resist material is applied to the upper surface of the layer being patterned, is exposed to a pattern of radiant energy, and is then developed to form a mask. An etching process is undertaken to etch away the surface of the layer through the mask. At the end of the photolithography process, the mask is typically removed.

A layer 38 of anti-fuse material such as A-Si is then deposited and patterned to remain only over the strap 36. Deposition is preferably performed by standard plasma enhanced chemical vapor deposition (PECVD) process. A range for the thickness of this layer 38 is between about 500–5000 Å, with 1200 Å being a preferred thickness for 0.8 µm technologies.

Figure 3:
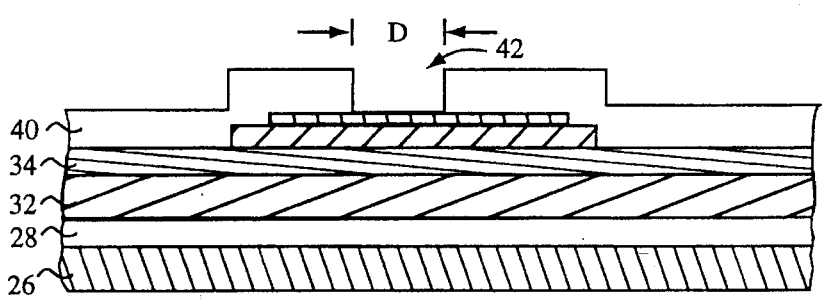

FIG. 3 illustrates the structure of FIG. 2 with the addition of an insulating layer 40. Silicon dioxide is a suitable material to use for this insulating layer, and PECVD is the preferable deposition method. An appropriate thickness for layer 40 is in the range of approximately 1000–10,000 Å, with 3000 Å having been found to work well. A via 42 is formed by patterning layer 40 by standard photolithographic and etch techniques. The lateral dimension "D" or width of the via is scalable to a desired dimension, but is preferably below about 0.8 µm, more preferably below about 0.6 µm. Of course, the structure can also be used with vias having greater than 0.8 µm lateral dimensions, but is particularly suitable for submicron applications.

Figure 4:
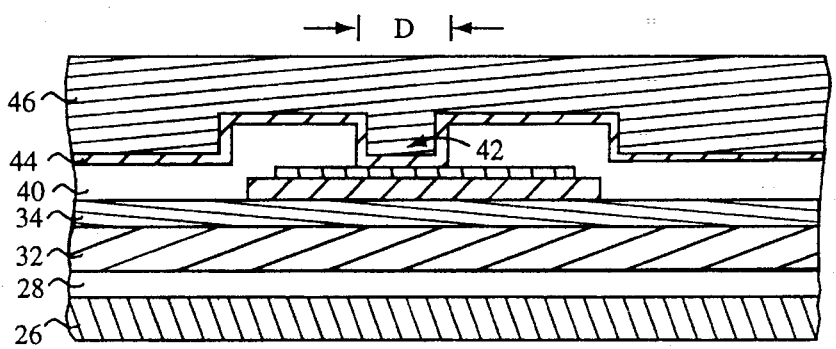

In a first preferred embodiment of the present invention, as seen in FIG. 4, a conformal barrier layer 44 of a non-aluminum conductor is deposited over the insulating layer 40 and into the via 42. Suitable non-aluminum conductors include, for example, TiW and TiN (titanium-nitride). The thickness of this layer is preferably between about 500–3000 Å, with 1000 Å having been found to work well. A suitable deposition process for a TiN layer is chemical vapor deposition (CVD) or sputter deposition, while sputter deposition techniques are suitable for TiW. A plug layer 46 is then deposited as a blanket layer over the barrier layer 44. Tungsten is preferably used as the plug layer 46, but W is not able to adhere well to the insulating oxide layer 40 so that the TiW or TiN also acts as an adhesion layer for the W plug deposition. The plug layer 46 is deposited to a thickness preferably approximately 0.8 times the lateral dimension "D" of the via 42, where, in this example D is preferably about 0.8 µm.

Figure 5:
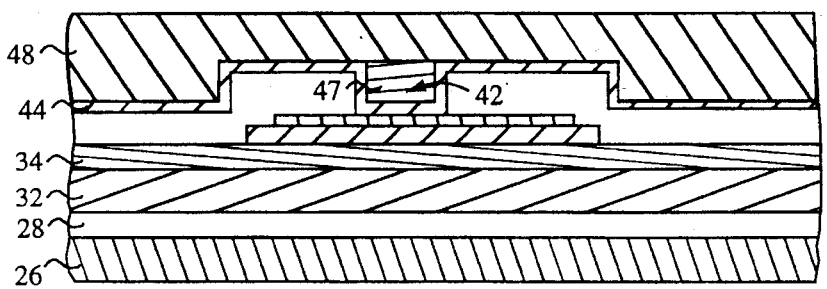

FIG. 5 illustrates the structure of FIG. 4 following etch-back of the plug layer 46. This forms a W plug 47 in the via hole 42. By way of example, etch-back of the plug layer is performed by plasma etch techniques well known to those skilled in the art. A layer 48 of aluminum is then deposited over the plug 47. With the plug 47, the conductive layer 48 is kept well away from the A-Si layer 38, and thus the possibility of degradation of the anti-fuse structure due to diffusion of the aluminum layer 48 into the anti-fuse layer 38 is all but eliminated.

The via hole 42 has a depth (after the barrier layer 44 is provided) which extends from the top surface of the barrier layer 44 that is within the via hole 42 to the rim of the via hole 42 that has been raised by the thickness of the barrier layer 44. As such, the depth of the via hole 42 is about the same depth of the via hole 42 before the barrier layer 44 was deposited. Preferably, the plug 47 has a height equal to at least one-half (½) of the depth of the via hole 42. This ensures that any aluminum is kept well away from the anti-fuse layer and further ensures that the crucial corners of the via hole 42 are filled with plug material.

Figure 6:
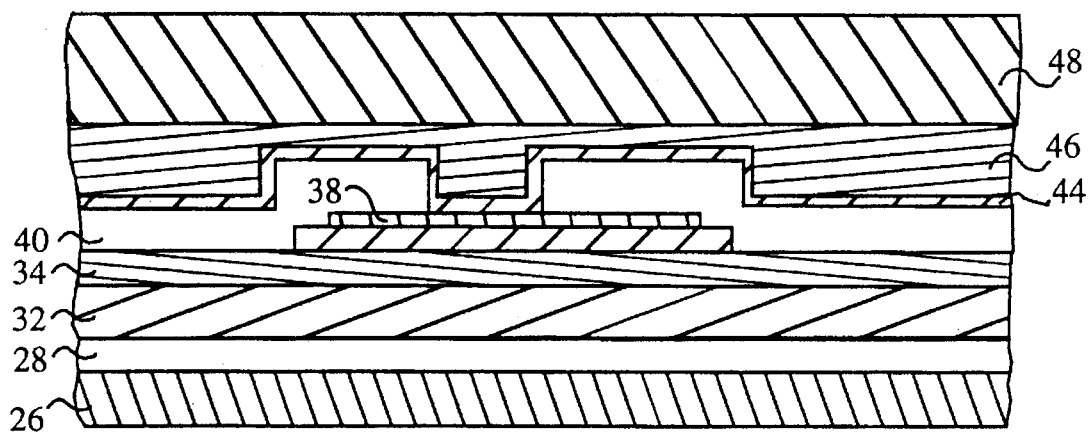
FIGS. 6–7 illustrate cross-sectional views of alternate anti-fuse structures in accordance with the present invention.
Figure 7:
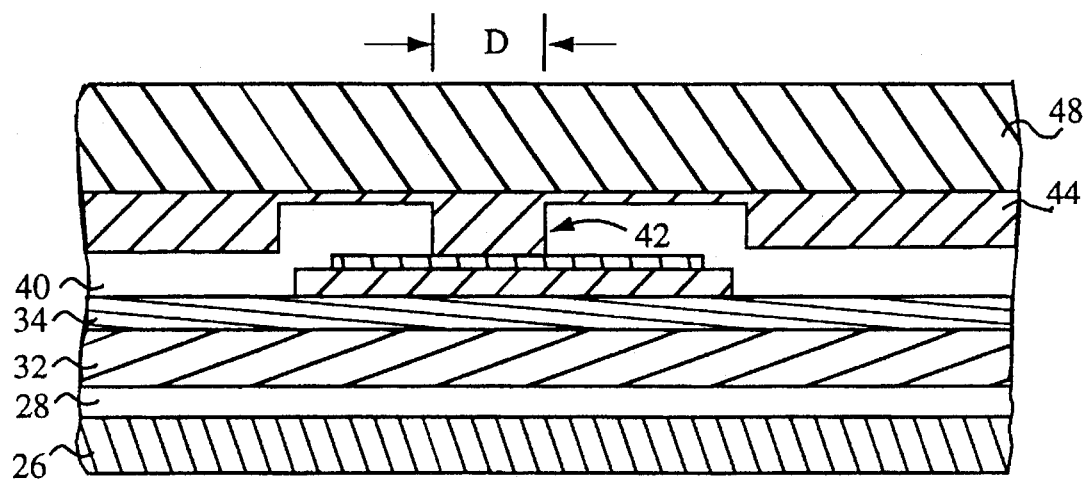

Alternatives to the structure of FIG. 5 that maintain the separation of the aluminum layer from the anti-fuse layer are illustrated in FIGS. 6 and 7. As shown in FIG. 6, the plug layer 46 is not etched-back from the via opening 42. Rather, the entire layer 46 remains over the barrier layer 44 and is also patterned as an interconnect. For low resistance interconnects, the conductive layer 48 is deposited over this blanket layer 46, and the two layers are patterned together. This, again, separates the aluminum layer 48 from the A-Si layer 38.

Another alternative, as shown in FIG. 7, eliminates the layer 46. The barrier layer 44 when formed with TiN is capable of serving as a non-Al plug. TiN is suitable since it is deposited by CVD and is therefore capable of filling the via 42. TiW, on the other hand, is deposited by sputter deposition and thus, would be unsuitable for filling the via 42. The TiN restricts the diffusion of the conductive layer 48 into the anti-fuse layer 38, while also acting as a suitable conductor during programming of the anti-fuse structure. In this embodiment, a suitable thickness of the TiN is approximately 0.8 times the lateral dimension "D" of the via 42.

It is therefore a key element of the present invention to use a non-Al conductive plug in the via hole over an A-Si anti-fuse layer. By "non-Al" plug, it is meant that the great majority of the atoms of the material within the via are not free Al atoms that can react with the A-Si. For example, any Al atoms in the TiW or TiN should be less than one part per million (ppm). Of course, it is impossible to provide absolutely pure materials to form plugs within vias, but the essence of the present invention is to minimize, to the extent practical, the number of Al atoms within the via in proximity to the A-Si layer, thereby forming a substantially non-Al plug within the via.

It should also be noted that the term "non-Al plug" covers a variety of structures. In one embodiment, the "non-Al plug" is a conformal TiW barrier layer with a "W plug" formed inside. In another embodiment, the "non-Al plug" is a conformal TiN barrier layer with a "W plug" formed inside. In a third embodiment, the "non-Al plug" is made from TiN. Therefore, the term "non-Al plug" will mean one or more conductive materials deposited within a via, which singly or together substantially fill the via.

Figure 8:
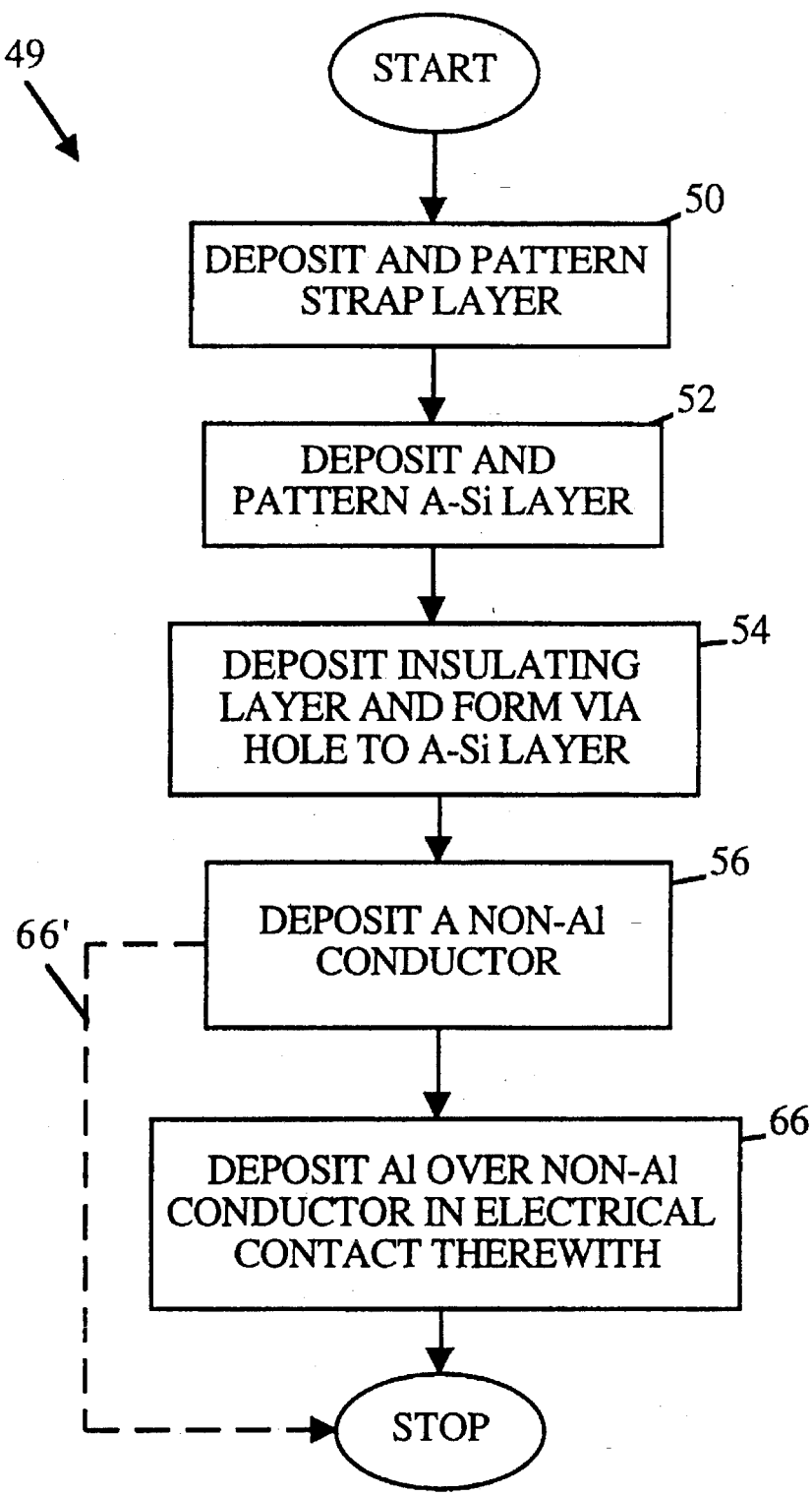
FIG. 8 is a flow diagram illustrating an overall process for forming an anti-fuse structure in the present invention.

The flow diagram of FIG. 8 illustrates a process 49 in accordance with the present invention. As shown, the process 49 begins with step 50 and the deposition and patterning of a strap layer over an initial substrate. The substrate is preferably an IMO layer overlying a metal layer such as Al, which is formed on a prepared silicon wafer or the like, as shown and described with reference to FIG. 2. TiW is suitable for use as the strap layer. Standard photolithographic techniques are preferably utilized to pattern the strap layer. At this stage of the process, the structure corresponds to layers 26–36 of FIG. 2.

Following the deposition and patterning of the strap layer, a layer of anti-fuse material such as A-Si layer 38 is deposited, such as by PECVD, and patterned in step 52. A preferable range for the thickness of this layer is between about 500–5000 Å, with 1200 Å being a suitable thickness for 0.8 μm technologies. Following the patterning step, the structure appears as illustrated in FIG. 2.

After patterning of the anti-fuse layer 38 is completed, an insulating layer 40 is deposited in step 54. Silicon dioxide is appropriate for this insulating layer. A via 42 is then etched through the insulating layer in the areas where the anti-fuse material is located. The via is preferably established by plasma etching through the insulating layer by techniques well known to those skilled in the art. The lateral dimension of this via is preferably no greater than about 0.8 μm, with less than 0.8 μm (e.g., 0.6 μm) being more preferable. At this point of the process, the structure appears as illustrated in FIG. 3.

Figure 9A:
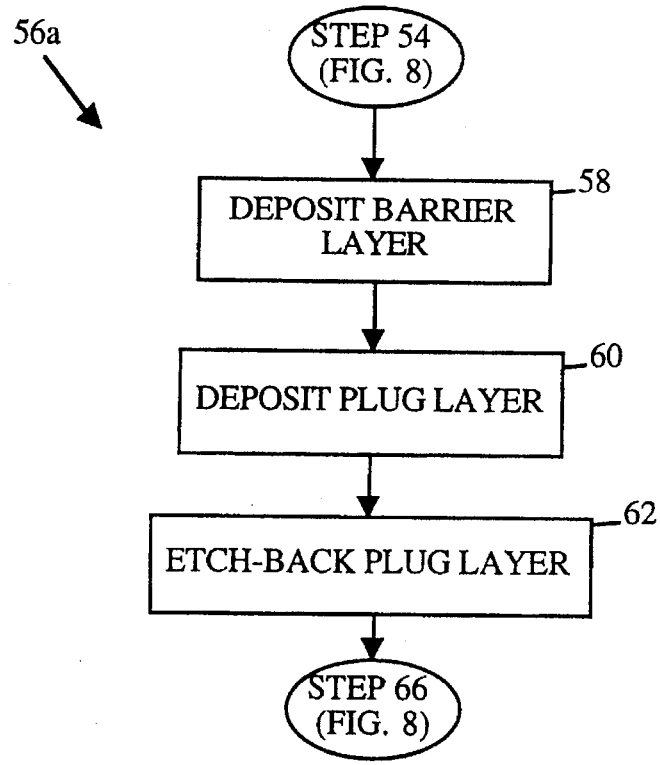
FIGS. 9a–9c are flow diagrams illustrating alternative processes for performing step 56 in the process shown in FIG. 8.

The process 49 continues with step 56 and the deposition of a non-Al conductor barrier layer 44 over the insulating layer and into the via. It is at this point in the process that alternative procedures are possible, as illustrated in the flow diagrams of FIGS. 9a–9c. As shown in FIG. 9a, in one embodiment, a process 56a involves three steps. First, in step 58, a barrier layer of a non-Al conductor is conformally deposited over the insulating layer and into the via establishing contact with the anti-fuse material. TiN, TiW, and other like materials are usable for this step. The thickness of this layer is in the range of about 500–3000 Å, with 1000 Å having been found to work well. Next, a plug layer, suitably comprised of W, is deposited over the barrier layer in step 60. A suitable thickness of the plug layer is approximately 0.8 times the lateral dimension D of the via 42. Then, in step 62, the plug layer is etched-back to form a plug in the via hole. The structure resulting from this process is shown with reference to FIG. 5.

Figure 9B:
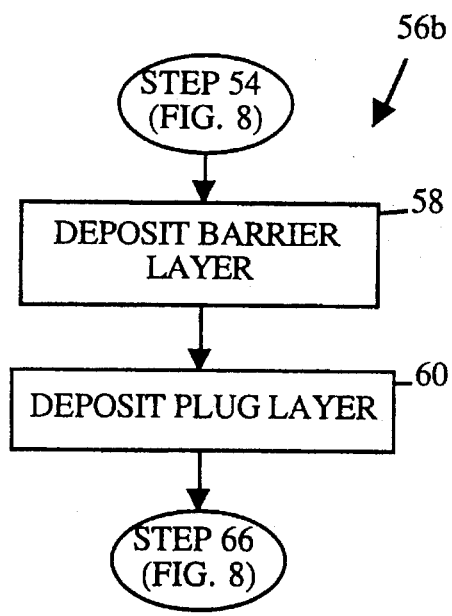

Alternatively, the flow diagram of FIG. 9b illustrates another embodiment, process 56b. This process is similar to that shown in FIG. 9a, except that step 60, the etch-back step, is not performed in this method. Rather, the plug layer remains over the entire barrier layer and in the via. This arrangement is illustrated and described with reference to FIG. 6.

Figure 9C:
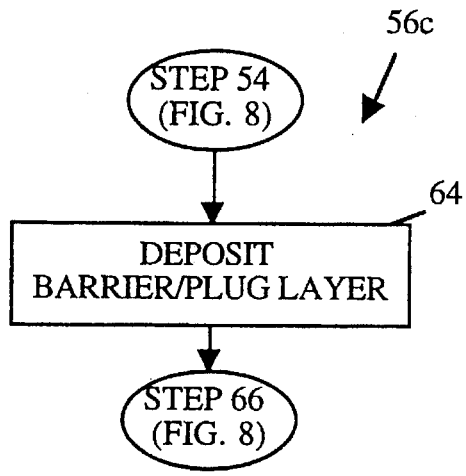

A third alternative for process 56c is illustrated in FIG. 9c. This embodiment comprises only a single step 64 of depositing a barrier/plug layer. For this embodiment, the barrier layer preferably comprises TiN since the layer needs to be able to form a plug in the via hole, and TiN is suitably capable of being deposited as a plug by CVD. TiN, besides being well-suited for plug formation by CVD deposition, also adheres well to silicon dioxide (SiO$_2$) unlike W. TiW would not be a material as satisfactory for use as a plug due to the required use of sputter deposition for its application, which could cause cusping, voids, and other defects. An appropriate thickness of the TiN for this embodiment is approximately 0.8 times the lateral dimension D of the via. The structure occurring with this embodiment is described in conjunction with FIG. 7.

The process then continues with the sequence illustrated in FIG. 8. Following step 56, (i.e., one of the processes 56a, 56b, or 56c) the next step 66 is the deposition of a conductive layer, e.g., Al, over the non-Al conductor layer. Alternatively, as the dashed arrow 66' indicates, since the barrier layer formed in step 56 is a conductive layer, the Al layer can be eliminated in some instances, so that the process could end following step 56. In either case, the anti-fuse structure maintains a lower conductive layer, an anti-fuse layer, and a top conductive layer with a via plug of a non-Al material connecting the top conductive layer with the bottom conductive layer through the anti-fuse layer. Accordingly, with this structure, anti-fuse programming is accomplished by applying a programming voltage of approximately 10 volts (V) between the conductive layers, and subsequent reading of the anti-fuse structure is accomplished by applying an appropriate sensing voltage, as is well known to those skilled in the art.

Although only a few embodiments of the present invention have been described in detail, it should be understood that the present invention may be embodied in many other specific forms without departing from the spirit or scope of the invention. Particularly, the invention has been described in the context of a strap layer comprised of TiW. Alternatively, the TiW could be replaced with W. Further, the non-Al conductive barrier layer could be formed using chromium in addition to or instead of the TiN and TiW described. Further, the range of thicknesses for the A-Si layer has been selected so that the layer is not too thin which could lead to leaking or too thick which would require a high programming voltage. Of course, in alternate applications having higher programming voltage capabilities, the upper limit on the range of thicknesses could be increased.

It is therefore intended that the following appended claims be interpreted as including all such alterations, permutations, and equivalents as fall within the true spirit and scope of the present invention.

What is claimed is:

1. A method for making an anti-fuse structure comprising the steps of:

forming a conductive base layer;

forming a layer of anti-fuse material over said conductive base layer;

forming an insulating layer over said anti-fuse layer;

forming a via hole having sides and having a lateral dimension no greater than about 0.8 microns through said insulating layer to said anti-fuse layer; and forming a conductive barrier layer consisting of a barrier material selected from the group consisting of TiW, TiN, and chromium, said conductive barrier layer having a first portion overlying said anti-fuse material, a second portion extending upward along said sides of said via hole and a third portion overlying a portion of said insulating layer;

providing a conductive non-Al plug above said first portion of said conductive barrier layer;

such that said anti-fuse structure may be programmed by providing a programming voltage between said conductive base layer and said conductive barrier layer, and may be read by providing a sensing voltage, which is lower than said programming voltage, between said conductive base layer and said barrier layer.

2. A method as recited in claim 1 wherein said lateral dimension of said via hole is no greater than about 0.6 microns.

3. A method as recited in claim 1 wherein said conductive barrier layer is conformally deposited within said via, and wherein said non-Al plug further includes a W plug within said via hole and in contact with said conductive barrier material.

4. A method as recited in claim 3 further comprising the step of providing a conductive line comprising aluminum over said conductive barrier layer and in contact with said W plug.

5. A method as recited in claim 3 wherein said W plug is provided by a deposition process which provides a blanket of tungsten over said conductive barrier layer and within said via hole.

6. A method as recited in claim 5 further comprising the step of etching-back said blanket of tungsten to substantially remove said blanket of tungsten outside of said via hole.

7. A method as recited in claim 6 further comprising the step of providing a conductive line comprising aluminum over said insulating layer and in contact with said W plug.

8. A method as recited in claim 1 wherein said conductive barrier layer comprises TiN, which substantially completely fills said via hole as said non-Al plug.

9. A method as recited in claim 1 wherein said conductive base layer is provided with a thickness in the range of about 1000–10,000 Å.

10. A method as recited in claim 9 wherein said conductive base layer is provided with a thickness of about 2200 Å.

11. A method as recited in claim 1 wherein said anti-fuse material is formed with a thickness in the range of about 500–5,000 Å.

12. A method as recited in claim 11 wherein said anti-fuse material is formed with a thickness of about 1200 Å.

13. A method as recited in claim 1 wherein said insulating layer is formed with a thickness in the range of about 1000–10,000 Å.

14. A method as recited in claim 13 wherein said insulating layer is formed with a thickness of about 3000 Å.

15. A method as recited in claim 1 wherein said conductive barrier layer is formed with a thickness in the range of about 500–3000 Å.

16. A method as recited in claim 15 wherein said conductive barrier layer is formed with a thickness of about 1000 Å.

17. A method as recited in claim 3 wherein said via hole has a depth, and wherein said W plug is provided with a height of at least ½ of said depth of said via hole.

18. A method as recited in claim 5 wherein said blanket layer of tungsten is provided with a thickness of about 0.8 times the lateral dimension of the via hole.

19. A method as recited in claim 8 wherein said barrier layer has a thickness of about 0.8 times the lateral dimension of the via hole.

* * * * *